US012289107B2

(12) United States Patent
Kong et al.

(10) Patent No.: US 12,289,107 B2
(45) Date of Patent: Apr. 29, 2025

(54) LOW-POWER RETENTION FLIP-FLOP

(71) Applicant: SK keyfoundry Inc., Cheongju-si (KR)

(72) Inventors: Wan-Chul Kong, Gwangju-si (KR); Sungbum Park, Seongnam-si (KR); Keesik Ahn, Hwaseong-si (KR)

(73) Assignee: SK keyfoundry Inc., Cheongju-si (KR)

( * ) Notice: Subject to any disclaimer, the term of this patent is extended or adjusted under 35 U.S.C. 154(b) by 0 days.

(21) Appl. No.: 17/548,923

(22) Filed: Dec. 13, 2021

(65) Prior Publication Data

US 2023/0017888 A1 Jan. 19, 2023

(30) Foreign Application Priority Data

Jul. 12, 2021 (KR) ........................ 10-2021-0091066

(51) Int. Cl.
| | |
|---|---|
| H03K 3/00 | (2006.01) |
| H03K 3/012 | (2006.01) |
| H03K 3/037 | (2006.01) |
| H03K 19/17736 | (2020.01) |
| H03K 19/17772 | (2020.01) |
| H03K 19/20 | (2006.01) |

(52) U.S. Cl.
CPC ........... *H03K 3/0372* (2013.01); *H03K 3/012* (2013.01); *H03K 19/1774* (2013.01); *H03K 19/17772* (2013.01); *H03K 19/20* (2013.01)

(58) Field of Classification Search
CPC .. H03K 3/0372; H03K 3/012; H03K 19/1774; H03K 19/17772; H03K 19/20
See application file for complete search history.

(56) References Cited

U.S. PATENT DOCUMENTS

| | | | | |
|---|---|---|---|---|
| 7,123,068 B1* | 10/2006 | Hoover | ................. | H03K 3/012 327/202 |
| 7,183,825 B2* | 2/2007 | Padhye | ................. | G11C 5/147 327/204 |
| 7,652,513 B2* | 1/2010 | Rao | ..................... | H03K 3/35625 327/218 |
| 7,908,500 B2* | 3/2011 | Westwick | ............. | G06F 1/3203 713/323 |

(Continued)

FOREIGN PATENT DOCUMENTS

JP 2013-34040 A 2/2013

OTHER PUBLICATIONS

Korean Office Action Issued on Nov. 21, 2022, in counterpart Korean Patent Application No. 10-2021-0091066 (4 Pages in Korean).

(Continued)

*Primary Examiner* — Tuan T Lam
(74) *Attorney, Agent, or Firm* — NSIP Law

(57) ABSTRACT

A low-power retention flip-flop is provided. The low-power retention flip-flop may include: a master latch configured to output an input signal based on first control signals; a slave latch configured to output the signal from the master latch based on second control signals; and a control logic configured to generate the first control signals based on a clock signal, and provide the generated first control signals to the master latch, and generate the second control signals based on the clock signal and a power down mode signal, and provide the generated second control signals to the slave latch.

12 Claims, 8 Drawing Sheets

(56) References Cited

U.S. PATENT DOCUMENTS

| | | | |
|---|---|---|---|
| 8,085,076 B2* | 12/2011 | Djaja | H03K 19/0016 |
| | | | 327/202 |
| 8,242,826 B2 | 8/2012 | Chi et al. | |
| 8,502,585 B2* | 8/2013 | Kuenemund | H03K 3/356008 |
| | | | 327/208 |
| 8,669,800 B2* | 3/2014 | Behrends | H03K 3/0375 |
| | | | 327/225 |
| 8,988,124 B2* | 3/2015 | Yokoyama | H03K 3/012 |
| | | | 327/202 |
| 2006/0220700 A1 | 10/2006 | Hoover et al. | |
| 2006/0220717 A1* | 10/2006 | Padhye | H03K 3/0375 |
| | | | 327/218 |
| 2007/0022344 A1 | 1/2007 | Branch et al. | |
| 2009/0058485 A1* | 3/2009 | Berzins | H03K 3/356008 |
| | | | 327/203 |
| 2011/0248759 A1 | 10/2011 | Chi et al. | |
| 2014/0167828 A1* | 6/2014 | Yang | H03K 3/0375 |
| | | | 327/202 |
| 2016/0301396 A1* | 10/2016 | Jayapal | H03K 3/356008 |

OTHER PUBLICATIONS

Korean Office Action issued on Apr. 6, 2023, in counterpart Korean Patent Application No. 10-2021-0091066 (6 pages in Korean).

* cited by examiner

LOW-POWER RETENTION FLIP-FLOP

CROSS-REFERENCE TO RELATED APPLICATIONS

This application claims the benefit under 35 USC § 119(a) of Korean Patent Application No. 10-2021-0091066, filed on Jul. 12, 2021, in the Korean Intellectual Property Office, the entire disclosure of which is incorporated herein by reference for all purposes.

BACKGROUND

1. Field

The following description relates to a low-power retention flip-flop.

2. Description of Related Art

In a typical digital circuit and/or system on chip (SoC), power may be supplied continuously even in an idle mode and/or a sleep mode, and leak current, which leaks to the ground throughout the entire circuit block, may be generated. Accordingly, as the number of gates of a standard cell within the digital circuit and/or SoC increases, a large amount of power may be consumed even in the idle mode and/or the sleep mode. Therefore, in order to reduce power consumption due to the current which leaks during the idle mode and/or the sleep mode, the power to at least some circuit blocks may be temporarily disconnected.

A flip-flop (F/F) is a representative sequential logic circuit which stores and maintains one-bit information, and enables data synchronization. The F/F is a structurally volatile storage device. The F/F maintains and stores continuously a previous state of data, and reflects an input signal to the output at an edge of a clock signal.

Since the flip-flop is a volatile storage device, all of the data may be lost when the power supply is cut off. Accordingly, when the power supply to the flip-flop is temporarily cut off during the idle and/or sleep modes in order to reduce power consumption, a problem may occur in that previous data may not be normally restored even if the power is supplied again later.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a retention flip-flop includes a master latch, configured to output an input signal based on first control signals; a slave latch, configured to output the signal from the master latch based on second control signals; and a control logic, configured to generate the first control signals based on a clock signal, and provide the generated first control signals to the master latch, and configured to generate the second control signals based on the clock signal and a power down mode signal, and provide the generated second control signals to the slave latch.

The slave latch may include a first circuit which continuously maintains a power-on state, transfers the output signal of the master latch based on the second control signals in a normal operation mode, and maintains the output signal of the master latch by forming a closed loop based on the second control signals in a power down mode; and an inverter, which is turned on in the normal operation mode, and is configured to invert and output the output signal of the first circuit, and is turned off in the power down mode.

The power down mode may be switched to the normal operation mode, the inverter may be turned on and inverts and outputs a signal of the closed loop.

The control logic may include a first inverter, configured to invert and output the clock signal; a second inverter, configured to invert and output the output signal of the first inverter; a first NOR gate, configured to perform a negative OR operation on the output signal of the first inverter and the power down mode signal; and a third inverter, configured to invert and output an output signal of the first NOR gate, wherein the first control signals may include a first clock signal that is the output signal of the first inverter, and a second clock signal that is the output signal of the second inverter, and wherein the second control signals may include a first power down clock signal that is the output signal of the first NOR gate, and a second power down clock signal that is the output signal of the third inverter.

When the power down mode signal is a low level indicating an inactive state of the power down mode, the second control signals may vary based on the clock signal, and when the power down mode signal is a high level indicating an active state of the power down mode, the second control signals may have a constant value regardless of the clock signal.

The retention flip-flop may include a first power terminal, configured to supply or cut off power based on an initiation of the power down mode; and a first power terminal, configured to supply or cut off power based on an initiation of the power down mode; and a second power terminal, configured to continuously supply the power regardless of the initiation of the power down mode, wherein the first power terminal may be connected to the master latch, the inverter of the slave latch, and circuit elements related to the first control signal in the control logic, and wherein the second power terminal may be connected to the first circuit of the slave latch, and circuit elements related to the second control signal in the control logic.

The circuit elements related to the first control signal may include at least one of the first inverter and the second inverter, and the circuit elements related to the second control signal may include at least one of the third inverter and the first NOR gate.

The control logic may be configured to generate a first negative reset signal based on an input negative reset signal and the power down mode signal and output the first negative reset signal to the master latch and the slave latch, respectively, and each of the master latch and the slave latch may be configured to receive the first negative reset signal and set an initial state value based on the received first negative reset signal.

The control logic may further include a second NOR gate, configured to perform a negative OR operation on the power down mode signal and the negative reset signal; and a fourth inverter, configured to generate the first negative reset signal by inverting an output signal of the second NOR gate and output the first negative reset signal.

The retention flip-flop may include a first power terminal, configured to supply or cut off power based on an initiation of the power down mode; and a second power terminal, configured to continuously supply the power regardless of the initiation of the power down mode, wherein the first power terminal may be connected to the master latch, the inverter of the slave latch, and circuit elements related to the first control signal in the control logic, and wherein the second power terminal may be connected to the first circuit of the slave latch, circuit elements related to the second control signal in the control logic, and circuit elements related to the first negative reset signal in the control logic.

Each of the master latch and the slave latch may include a NAND gate, configured to perform a negative OR operation on the negative reset control signal, and a signal of a node within each of the master latch and the slave latch.

The control logic may be configured to generate a first negative set signal based on an input negative set signal and the power down mode signal, and output the first negative set signal to the master latch and the slave latch, respectively, and each of the master latch and the slave latch may be configured to receive the first negative set signal and set an initial state value based on the received first negative set signal.

The control logic may further include a second NOR gate, configured to perform a negative OR operation on the power down mode signal and the negative set signal; and a fourth inverter, configured to generate the first negative set signal by inverting an output signal of the second NOR gate and output the first negative set signal.

The retention flip-flop may include a first power terminal, configured to supply or cut off power based on an initiation of the power down mode; and a second power terminal, configured to continuously supply the power regardless of the initiation of the power down mode, wherein the first power terminal is connected to the master latch, the inverter of the slave latch, and circuit elements related to the first control signal in the control logic, and the second power terminal may be connected to the first circuit of the slave latch, circuit elements related to the second control signal in the control logic, and circuit elements related to the first negative set signal in the control logic.

Each of the master latch and the slave latch may include a NAND gate, configured to perform a negative OR operation on the first negative set signal, and a signal of a node within each of the master latch and the slave latch.

In a general aspect, a retention flip-flop includes a first power terminal, configured to supply or cut off power in accordance with a power down mode; a second power terminal, configured to continuously supply the power regardless of an initiation of a power down mode; a master latch, which is connected to the first power terminal, and is configured to output an input signal based on first control signals; a slave latch, which is connected to the first power terminal and the second power terminal, and is configured to output the signal from the master latch based on second control signals; and a control logic, which is connected to the first power terminal and the second power terminal, and is configured to generate the first control signals based on a clock signal and provide the first control signals to the master latch, and generate the second control signals based on the clock signal and a power down mode signal and provide the second control signals to the slave latch.

The slave latch may include a first circuit which is connected to the second power terminal, and is configured to transfer the output signal of the master latch in accordance with the second control signals in a normal operation mode, and maintain the output signal of the master latch by forming a closed loop based on the second control signals in the power down mode; and an inverter which is connected to the first power terminal, and is configured to invert and output the output signal of the first circuit in the normal operation mode, and is turned off in the power down mode, wherein, when the power down mode is switched to the normal operation mode, the inverter is configured to receive power from the first power terminal, and invert and output the signal in the first circuit.

The control logic may include first logic gates, configured to generate the first control signals, based on the clock signal; and second logic gates, configured to generate the second control signals, based on the clock signal and the power down mode signal, wherein the first logic gates are connected to the first power terminal, and the second logic gates are connected to the second power terminal.

The second logic gates may include a NOR gate, configured to perform a negative OR operation on an inverted clock signal and the power down mode signal; and a first inverter, configured to invert and output an output signal of the NOR gate.

The control logic may be configured to generate a third control signal based on the power down mode signal and any one of a negative reset signal and a negative set signal, and output the third control signal to the master latch and the slave latch, respectively, and each of the master latch and the slave latch is configured to receive the third control signal, and set an initial state value based on the received third control signal.

In a general aspect, a flip-flop includes a master latch, configured to receive power from a first power terminal, and output or store an input signal based on a first clock signal and a second clock signal; a slave latch, configured to receive power from the first power terminal and a second power terminal, and configured to receive the input signal from the master latch, and output or store the received input signal based on a first power down clock signal and a second power down clock signal; and a control logic, configured to generate the first clock signal and the second clock signal, and configured to generate the first power down clock signal and the second power down clock signal.

The slave latch may be configured to continuously receive power from the second power terminal.

A first circuit element of the slave latch may be configured to receive power from the first power terminal, and second circuit elements of the slave latch other than the first circuit element may be configured to receive power from the second power terminal.

Other features and aspects will be apparent from the following detailed description, the drawings, and the claims.

Figure 1:
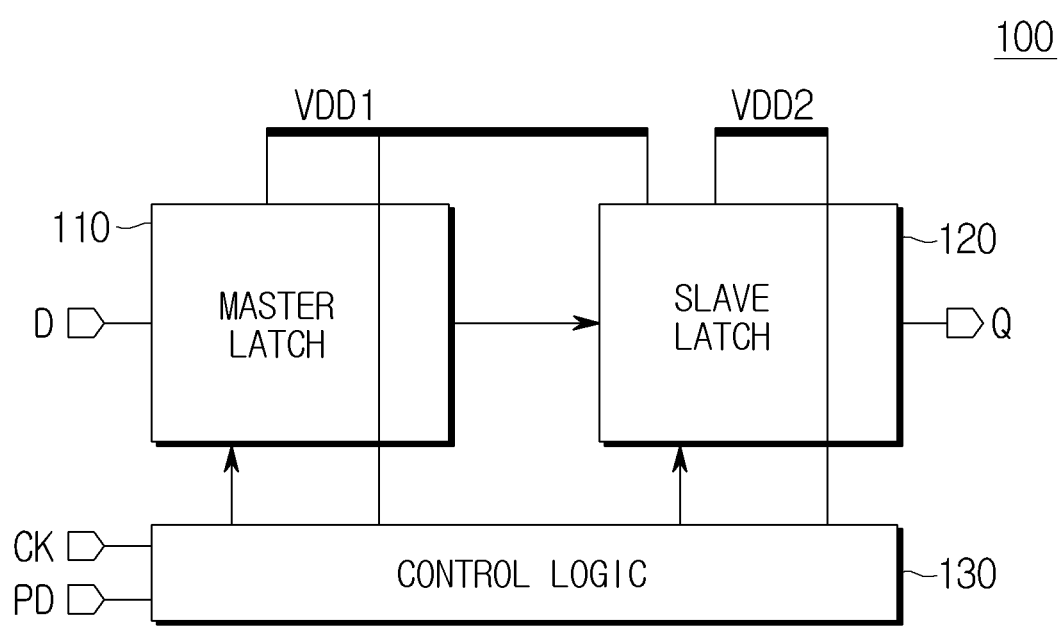
FIG. 1 illustrates a block diagram of an example low-power retention flip-flop, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Unless otherwise defined, all terms used herein including technical or scientific terms have the same meaning as commonly understood by one of ordinary skill in the art to which examples belong. Terms, such as those defined in commonly used dictionaries, are to be interpreted as having a meaning that is consistent with their meaning in the context of the relevant art, and are not to be interpreted in an idealized or overly formal sense unless expressly so defined herein.

Hereinafter, example embodiments will be described in detail with reference to the accompanying drawings. When describing the example embodiments with reference to the accompanying drawings, like reference numerals refer to like elements and a repeated description related thereto will be omitted.

Accordingly, various examples disclose a low-power retention flip-flop which holds or stores data during a power down mode in which the power supply is cut off to at least some circuits.

In one or more examples, at least some circuits (e.g., slave latch and power down logic) within the low-power retention flip-flop may always receive power regardless of a power down mode, so that they can perform a normal flip-flop function in a normal operation mode, and form a closed loop in the power down mode and hold data. Additionally, in one or more examples, low-power retention flip-flop that hold data in a low-power down mode only by minimum elements without retention latches, may be implemented.

Figure 2:
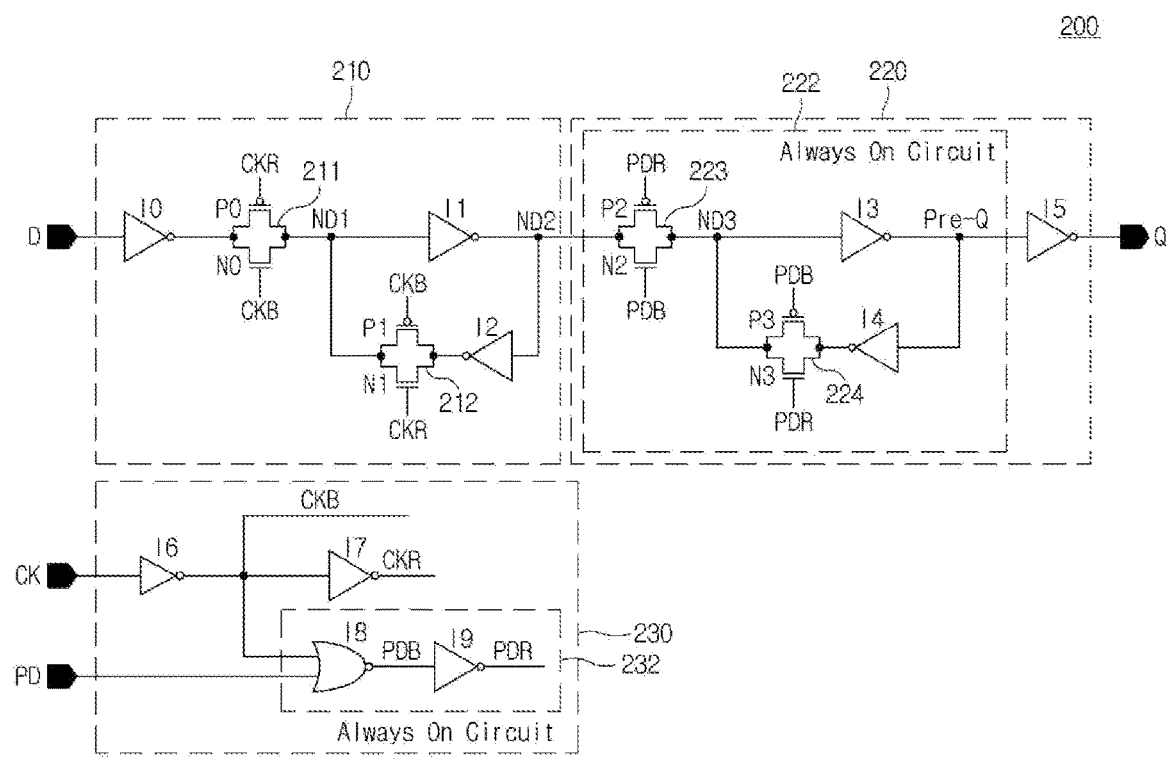
FIG. 2 illustrates an example circuit structure of an example low-power retention flip-flop, in accordance with one or more embodiments.

FIG. 1 illustrates a block diagram of an example low-power retention flip-flop 100, in accordance with one or more embodiments. In the example, detailed structures of the components shown in FIG. 1 will be described with reference to FIG. 2. FIG. 2 illustrates an example circuit structure of an example low-power retention flip-flop 200, in accordance with one or more embodiments. The low-power retention flip-flop described in the following examples may be a D flip-flop.

Referring to FIG. 1, the low-power retention flip-flop 100 may include a master latch 110, a slave latch 120, and a control logic 130.

In one or more examples, the master latch 110 may receive power through a first power terminal VDD1, and may store (maintain) or output an input signal D in accordance with first and second clock signals CKB and CKR provided from the control logic 130.

In an example, the master latch 110 may transfer the input signal D to the slave latch 120 at the rising edge of the clock signal, and the slave latch 120 may hold data at the falling edge of the clock signal, so that the state can be maintained until the next input signal D comes in. VDD1 may be referred to as a first power terminal.

In one or more examples, as illustrated in FIG. 2, the master latches 110 and 210 may include a first inverter (or NOT gate) I0, a first transfer gate 211, a second transfer gate 212, a second inverter I1, and a third inverter I2. The first transfer gate 211 of the master latches 110 and 210 may include a first PMOS transistor P0 and a first NMOS transistor N0 connected in parallel between an output terminal of the first inverter I0 and a first node ND1. The second transfer gate 212 of the master latches 110 and 210 may include a second PMOS transistor P1 and a second NMOS transistor N1 connected in parallel between the first node ND1 and the third inverter I2. In an example, the first clock signal CKB may be input to a gate of the first NMOS transistor N0 and a gate of the second PMOS transistor P1, and the second clock signal CKR may be input to a gate of the first PMOS transistor P0 and a gate of the second NMOS transistor N1. The first clock signal CKB may be obtained by inverting a clock signal CK, and the second clock signal CKR may be obtained by inverting the first clock signal CKB. The second inverter I1 of the master latches 110 and 210 may be connected to the first node ND1 and a second node ND2. Specifically, an input of the second inverter I1 may be connected to the first node ND1, and an output of the second inverter I1 may be connected to the second node ND2. The third inverter I2 may be connected to the second node ND2 and the second transfer gate 212. Specifically, an input of the third inverter I2 may be connected to the second node ND2, and an output of the third inverter I2 may be connected to the second transfer gate 212.

In one or more examples, the first inverter I0 of the master latch 110 may invert and output the input signal D, and the first transfer gate 211 may output an output signal of the first inverter I0 to the first node ND1 based on the first clock signal CKB and the second clock signal CKR. The second inverter I1 may invert a signal of the first node ND1 and output the inverted signal to the second node ND2, and the third inverter I2 may invert a signal of the second node ND2 and output the inverted signal to the second transfer gate 212. The second transfer gate 212 may output an output signal of the third inverter I2 to the first node ND1 based on the first clock signal CKB and the second clock signal CKR.

In one or more examples, the slave latches 120 or 220 may receive power through the first power terminal VDD1 and/or the second power terminal VDD2 (a second power terminal) and may store (maintain) or output an output signal of the master latches 110 and 210 in accordance with first and second power down clock signals PDB and PDR provided from the control logic 130 and 230. The output signal of the latch 110 may be stored (maintained) or output. In an example, the slave latches 120 and 220 may always or continuously receive power through the second power terminal VDD2. The power through the second power terminal VDD2 may be provided to all the circuit elements within the slave latches 120 and 220 other than an inverter (e.g., a sixth inverter I5) disposed at an output terminal of the slave latch 120. In one or more examples, the first and second power down clock signals PDB and PDR may be generated by the control logic 130 and 230 based on the clock signal CK and a power down signal PD. VDD2 may be referred to as a second power terminal, and the power down signal PD may be referred to as a power down mode signal.

In one or more examples, as illustrated in FIG. 2, the slave latches 120 and 220 may include a third transfer gate 223, a fourth transfer gate 224, a fourth inverter I3, a fifth inverter I4, and a sixth inverter I5.

The third transfer gate 223 of the slave latches 120 and 220 may include a third PMOS transistor P2 and a third NMOS transistor N2 connected in parallel between an output terminal of the master latches 110 and 210 and a third node ND3. The fourth transfer gate 224 of the slave latches 120 and 220 may include a fourth PMOS transistor P3 and a fourth NMOS transistor N3 connected in parallel between the third node ND3 and the fifth inverter I4. In an example, the first power down clock signal PDB may be input to a gate of the third NMOS transistor N2 and a gate of the fourth PMOS transistor P3, and the second power down clock signal PDR may be input to a gate of the third PMOS transistor P2 and a gate of the fourth NMOS transistor N3. The first power down clock signal PDB may be obtained based on a NOR operation on the first clock signal CKB and the power down signal PD, and the second power down clock signal PDR may be obtained by inverting the first power down clock signal PDB. The fourth inverter I3 of the slave latches 120 and 220 may be connected to the third node ND3 and a fourth node Pre-Q. Specifically, an input of the fourth inverter I3 may be connected to the node ND3, and an output of the fourth inverter I3 may be connected to the fourth node Pre-Q. The fifth inverter I4 may be connected to the fourth node Pre-Q and the fourth transfer gate 224. Specifically, an input of the fifth inverter I4 may be connected to the fourth node Pre-Q, and an output of the fifth inverter I4 may be connected to the fourth transfer gate 224.

In an example, the third transfer gate 223 of the slave latches 120 and 220 may output the output signal of the master latches 110 and 210 to the third node ND3 based on the first power down clock signal PDB and the second power down clock signal PDR. The fourth inverter I3 may invert a signal of the third node ND3 and output the inverted signal to the fourth node Pre-Q, and the fifth inverter I4 may invert a signal of the fourth node Pre-Q and output the inverted signal to the fourth transfer gate 224. The fourth transfer gate 224 may output the output signal of the fifth inverter I4 to the third node ND3 based on the first power down clock signal PDB and the second power down clock signal PDR. The sixth inverter I5 may invert the signal of the fourth node Pre-Q and output the inverted signal to an output terminal Q.

In one or more examples, the sixth inverter I5 disposed at the output terminal of the slave latches 120 and 220 may be connected to the first power terminal VDD1, and may receive power through the first power terminal VDD1, and other circuit elements 222 may be connected to the second power terminal VDD2 and may continually receive power through the second terminal VDD2. In one or more examples, the power through the first power terminal VDD1 may be supplied or cut off according to a power down mode, and the power through the second power terminal VDD2 may always be supplied regardless of the initiation of the power down mode. In an example, the third transfer gate 223, the fourth transfer gate 224, the fourth inverter I3, and the fifth inverter I4 of the slave latches 120 and 220 may be an Always-on-circuit which always receives the power through the second power terminal VDD2, irrespective of a normal operation mode or the power down mode.

In one or more examples, the control logics 130 and 230 may output a signal to control at least one transfer gate included in the master latches 110 and 210 and the slave latches 120 and 220, based on the clock signal CK and/or the power down signal PD. In one or more examples, as illustrated in FIG. 2, the control logic 130 may include a seventh inverter I6, an eighth inverter I7, a NOR gate I8, and a ninth inverter I9.

In one or more examples, the control logics 130 and 230 may output the first and second clock signals CKB and CKR to control the first and second transfer gates 211 and 212 of the master latches 110 and 210 based on the input clock signal CK, by using the two inverters I6 and I7. In an example, the control logics 130 and 230 may invert the input clock signal CK by using the seventh inverter I6, and output the first clock signal CKB, and may invert again, by using the eighth inverter I7, the first clock signal CKB output from the seventh inverter I6, and may output the second clock signal CKR, which is identical to the original clock signal CK. The control logics 130 and 230 may provide the first clock signal CKB output from the seventh inverter I6 and the second clock signal CKR output from the eighth inverter I7 to the first and second transfer gates 211 and 212 of the master latches 110 and 210.

In one or more examples, the control logics 130 and 230 may use the NOR gate I8 and the two inverters I6 and I9, and thus, may output the first and second power down clock signals PDB and PDR to control the third and fourth transfer gates 223 and 224 of the slave latches 120 and 220, based on the input clock signal CK and the power down signal PD. In an example, the control logics 130 and 230 may receive the power down signal PD and the first clock signal CKB output from the seventh inverter I6, and may output the first power down clock signal PDB by using the NOR gate I8 performing a NOR (Negative OR) operation. The control logics 130 and 230 may invert, by using the ninth inverter I9, the first power down clock signal PDB output from the NOR gate I8, and may output the second power down clock signal PDR. The control logics 130 and 230 may provide the first power down clock signal PDB output from the NOR gate I8 and the second power down clock signal PDR output from the ninth inverter I9 to the third and fourth transfer gates 223 and 224 of the slave latches 120 and 220.

In one or more examples, some circuit elements of the control logics 130 and 230 may be connected to the first power terminal VDD1, and may receive power through the first power terminal VDD1, and other circuit elements may be connected to the second power terminal VDD2, and may receive power through the second power terminal VDD2. In an example, in the control logics 130 and 230, circuit elements (e.g., PD-related buffers) that generate the first and second power down clock signals for controlling the transfer gates of the slave latches 120 and 220 may be connected to the second power terminal VDD2, and may receive power through the second power terminal VDD2. In an example, the NOR gate I8 and the ninth inverter I9 within the control logics 130 and 230 may be an Always-on-circuit which always receives power through the second power terminal VDD2, irrespective of a normal operation mode or the power down mode.

As described above, in one or more examples, in the low-power retention flip-flop, regardless of the operation mode, some circuit elements 222 and 232 within the slave latches 120 and 220 and the control logics 130 and 230, may always receive power, and the first and second power down clock signals PDB and PDR to control the third and fourth transfer gates 223 and 224 of the slave latches 120 and 220 based on the clock signal CK and the power down signal PD may be created. Accordingly, the slave latch 120 may operate normally based on the clock signal CK in the normal operation mode, and may form a closed loop in the power down mode and hold data immediately before entering the power down mode.

In one or more examples, in a normal operation mode not in an idle mode and/or a sleep mode, the power down signal PD may become a low level indicating an inactive state of the power down mode. Accordingly, on the basis of the NOR operation of the NOR gate I8, the first and second power down clock signals PDB and PDR may not be affected by the power down signal PD, and may vary depending on the first clock signal CKB input from the seventh inverter I6. Accordingly, in the normal operation mode, the slave latches 120 and 230 may operate according to the clock signal CK. In an example, in the normal operation mode, the slave latches 120 and 230 may operate in the same manner as the master latches 110 and 210 in accordance with the clock signal CK.

In one or more examples, in the power down mode due to the idle mode and/or sleep mode, the power down signal PD may become a high level indicating an active state of the power down mode. In the power down mode, power supply to the clock signal CK-related buffers (e.g., the seventh inverter I6 and the eighth inverter I7) within the control logics 130 and 230 may be cut off, so that the first and second clock signals CKB and CKR fall to a ground level.

Meanwhile, in the power down mode, power supply to the power down signal PD-related buffers (e.g., the NOR gate I8 and the ninth inverter I9) may be maintained, so that the control logics 130 and 230 may provide the first and second power down clock signals PDB and PDR according to the power down signal PD to the third and fourth transfer gates 223 and 224 of the slave latches 120 and 220. In the power down mode, the power down signal PD in an active state is input, so that the first and second power down clock signals PDB and PDR may not be affected by the first clock signal CKB by the NOR operation of the NOR gate I8 and can be always output with the same value. The third and fourth transfer gates 223 and 224 within the slave latches 120 and 220 may be turned on by the first and second power down clock signals PDB and PDR, so that some circuit elements (e.g., Always-on-circuit) that always receive power through the second power terminal VDD2 can form a closed loop. Accordingly, some circuit elements 222 within the slave latches 120 and 220 may continuously hold data before entering the power down mode. Then, when the power down mode is terminated and power is normally supplied to the entire circuit, the sixth inverter I5 disposed at the output terminal of the slave latches 120 and 220 inverts the values held in some circuit elements 222, thereby outputting the data before entering the power down mode.

Generally, in a data storage circuit such as a flip-flop, in order to prevent circuit malfunction, an initial state may be set to a specific value by receiving an external reset and/or set signal. Accordingly, various examples disclose a circuit structure of the low-power retention flip-flop having a reset function and/or a set function capable of setting an initial state to a specific value.

Figure 3:
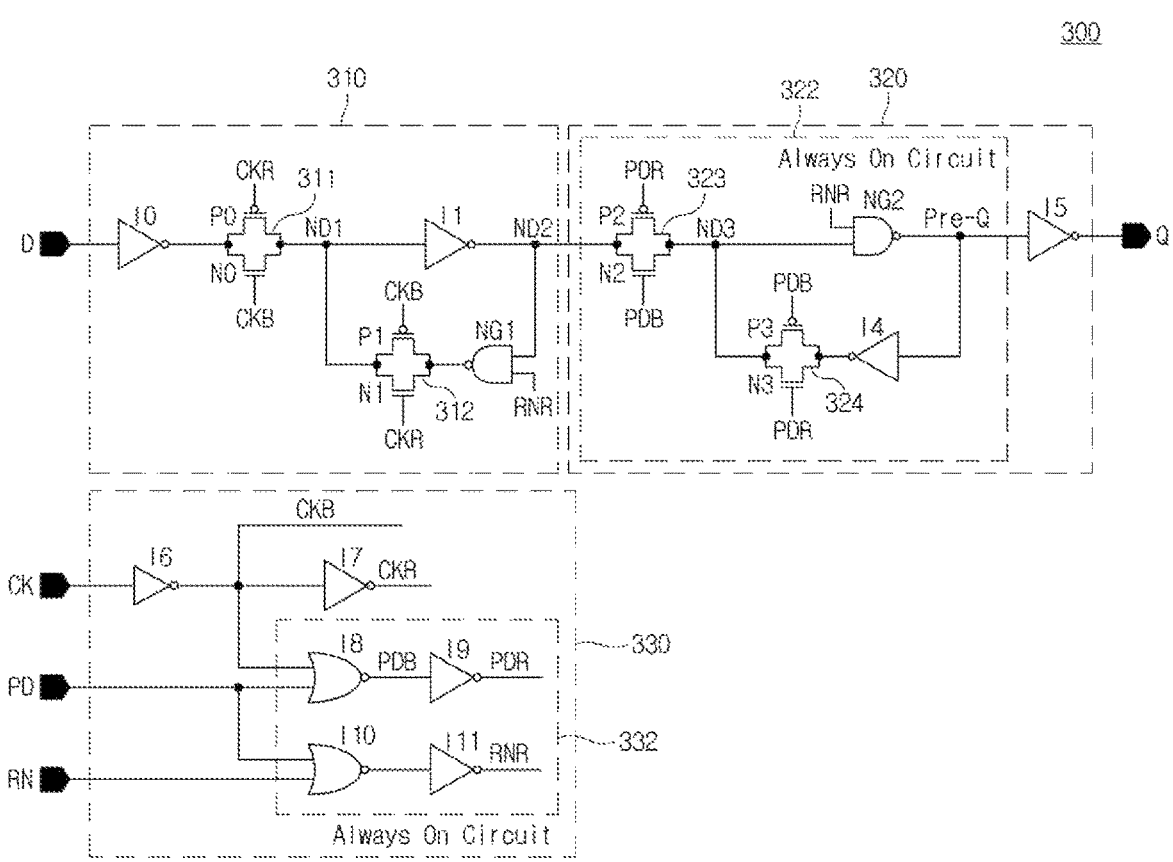
FIG. 3 illustrates an example circuit structure of an example low-power retention flip-flop which has a negative reset function, in accordance with one or more embodiments.

FIG. 3 illustrates an example circuit structure of an example low-power retention flip-flop which has a negative reset function, in accordance with one or more embodiments.

FIG. 3 illustrates an example circuit structure to which the negative reset function is added, as an embodiment of the low-power retention flip-flop 100 illustrated in FIG. 1.

Referring to FIG. 3, the low-power retention flip-flop 300 may include a master latch 310, a slave latch 320, and a control logic 330. The master latch 310, the slave latch 320, and the control logic 330 may be the same as the master latches 110 and 210, the slave latches 120 and 220, and the control logics 130 and 230 of respective FIGS. 1 and 2.

In one or more examples, the master latch 310 may receive power through first power terminal VDD1, and may store (maintain) or output the input signal D in accordance with the first and second clock signals CKB and CKR provided from the control logic 330. In one or more examples, the master latch 310 may receive a first negative reset signal RNR provided from the control logic 330, in order to set an initial state to a specific value.

In one or more examples, as illustrated in FIG. 3, the master latch 310 may include the first inverter I0, a first transfer gate 311, a second transfer gate 312, the second inverter I1, and a first NAND gate NG1. The master latch 310 illustrated in FIG. 3 is different from the master latch 210 illustrated in FIG. 2 in that the master latch 310 includes the NAND gate NG1 instead of an inverter I2 between the second node ND2 and the second transfer gate 312. The other components of the master latch 310 may be the same as the components of the master latch 210 of FIG. 2. The first NAND gate NG1 of the master latch 310 may perform a negative OR operation on the first negative reset signal RNR, and a signal of the second node ND2, and may output the result of the operation. The first negative reset signal RNR may be generated based on a negative reset signal RN and the power down signal PD. When the first negative reset signal RNR is at a high level, the output of the first NAND gate NG1 may vary depending on the signal of the second node ND2. When the first negative reset signal RNR is at a low level, the first NAND gate NG1 may output a high-level signal by the first negative reset signal RNR, regardless of the signal of the second node ND2. In an example, since the structure and operation of the master latch 310, other than the inclusion of the first NAND gate NG1, may be the same as the structure and operation of the master latch 210 illustrated in FIG. 2, a description thereof will be omitted.

In an example, as illustrated in FIG. 3, the slave latch 320 may include a third transfer gate 323, a fourth transfer gate 324, a second NAND gate NG2, the fifth inverter I4, and the sixth inverter I5. The slave latch 320 may be different from the slave latch 220 illustrated in FIG. 2 in that the slave latch 320 includes the second NAND gate NG2 instead of an inverter I3 between the third node ND3 and the fourth node Pre-Q. The other components 322 of the slave latch 320 may be the same as the other components 222 of the slave latch 220 illustrated in FIG. 2. The second NAND gate NG2 of the slave latch 320 may perform a negative OR operation on the first negative reset signal RNR and a signal of the third node ND3 and may output the result. When the first negative reset signal RNR is at a high level, the output of the second NAND gate NG2 may vary depending on the signal of the third node ND3. When the first negative reset signal RNR is at a low level, the second NAND gate NG2 may output a high-level signal by the first negative reset signal RNR, regardless of the output signal of the third node ND3. In an example, since the structure and operation of the slave latch 320 other than the inclusion of the second NAND gate NG2 may be the same as the structure and operation of the slave latch 220 illustrated in FIG. 2, a description thereof will be omitted.

In one or more examples, the control logic 330 may output a signal to control at least one transfer gate included in the master latch 310 and the slave latch 320, based on the clock signal CK and/or the power down signal PD.

In one or more examples, the control logic 330 may output the first negative reset signal RNR to set the initial states of the master latch 310 and the slave latch 320 to a specific value, based on the negative reset signal RN and the power down signal PD.

In one or more examples, as illustrated in FIG. 3, the control logic 330 may include the seventh inverter I6, the eighth inverter I7, the first NOR gate I8, the ninth inverter I9, and a second NOR gate I10, and a tenth inverter I11. In an example, the seventh inverter I6, the eighth inverter I7, the first NOR gate I8, and the ninth inverter I9 may be connected in the same structure as the structure of the control logic 230 illustrated in FIG. 2, and may operate in the same manner. In an example, the control logic 330 may be configured such that the second NOR gate I10 and the tenth inverter I11 are further included in the structure of the control logic 230 illustrated in FIG. 2.

In an example, a method that outputs the first clock signal CKB, the second clock signal CKR, the first power down clock signal PDB, and the second power down clock signal PDR, which control the transfer gates of the master latch 310 and the slave latch 320 based on the clock signal CK and/or the power down signal PD to which the control logic 330 is input, may be the same as the control logic 230 of FIG. 2.

In one or more examples, the control logic 330 may output the first negative reset signal RNR to be provided to the NAND gates NG1 and NG2 of the master latch 310 and the slave latch 320, based on the power down signal PD and the negative reset signal RN which are input by using the second NOR gate I10 and the tenth inverter I11. In an example, the control logic 330 may perform a NOR (Negative OR) operation on the power down signal PD and the negative reset signal RN through the NOR gate I10, may invert the NOR result through the tenth inverter I11, and then may output the first negative reset signal RNR.

In an example, when a reset event does not occur, the negative reset signal RN may be at a high level. In this example, since the second NOR gate I10 may always output a low-level signal regardless of the power down signal PD, the tenth inverter I11 may output the high-level first negative reset signal RNR.

In one or more examples, when a reset event occurs, the negative reset signal RN may be at a low level. In this example, the output signal of the second NOR gate I10 may vary depending on the power down signal PD. However, since the reset event and a switching event to the power down mode may not occur at the same time, the power down signal PD may become a low level indicating an inactive state of the power down mode while the negative reset signal RN is at a low level. Accordingly, the output signal of the second NOR gate I10 may become a high level, and the tenth inverter I11 may output the low-level first negative reset signal RNR.

In one or more examples, some circuit elements of the control logic 330 may be connected to the first power terminal VDD1 to receive power through the first power terminal VDD1, and some circuit elements may be connected to the second power terminal VDD2 to receive power through the second power terminal VDD2. In the control logic 330 of FIG. 3, not only the circuit elements (e.g., PD-related buffers) which generate the first and second power down clock signals to control the transfer gates of the slave latch 320, but also the circuit elements (e.g., RN-related buffers) which generate the first negative reset signal RNR may also be connected to the second power terminal VDD2 to receive power through the second power terminal VDD2. In an example, the first NOR gate I8, the ninth inverter I9, the second NOR gate I10, and the tenth inverter I11 within the control logic 330 may be an Always-on-circuit which always receives the power through the second power terminal VDD2, irrespective of the normal operation mode or the power down mode. In an example, the power may also always be supplied to the second NOR gate I10 and the tenth inverter I11. Accordingly, the first negative reset signal RNR supplied to the slave latch 320 of FIG. 3 can be maintained even in the power down mode.

As described above, in the low-power retention flip-flop according to one or more examples, the output terminal Q of the slave latch can be set to 1'b0 by using the negative reset signal.

Figure 4:
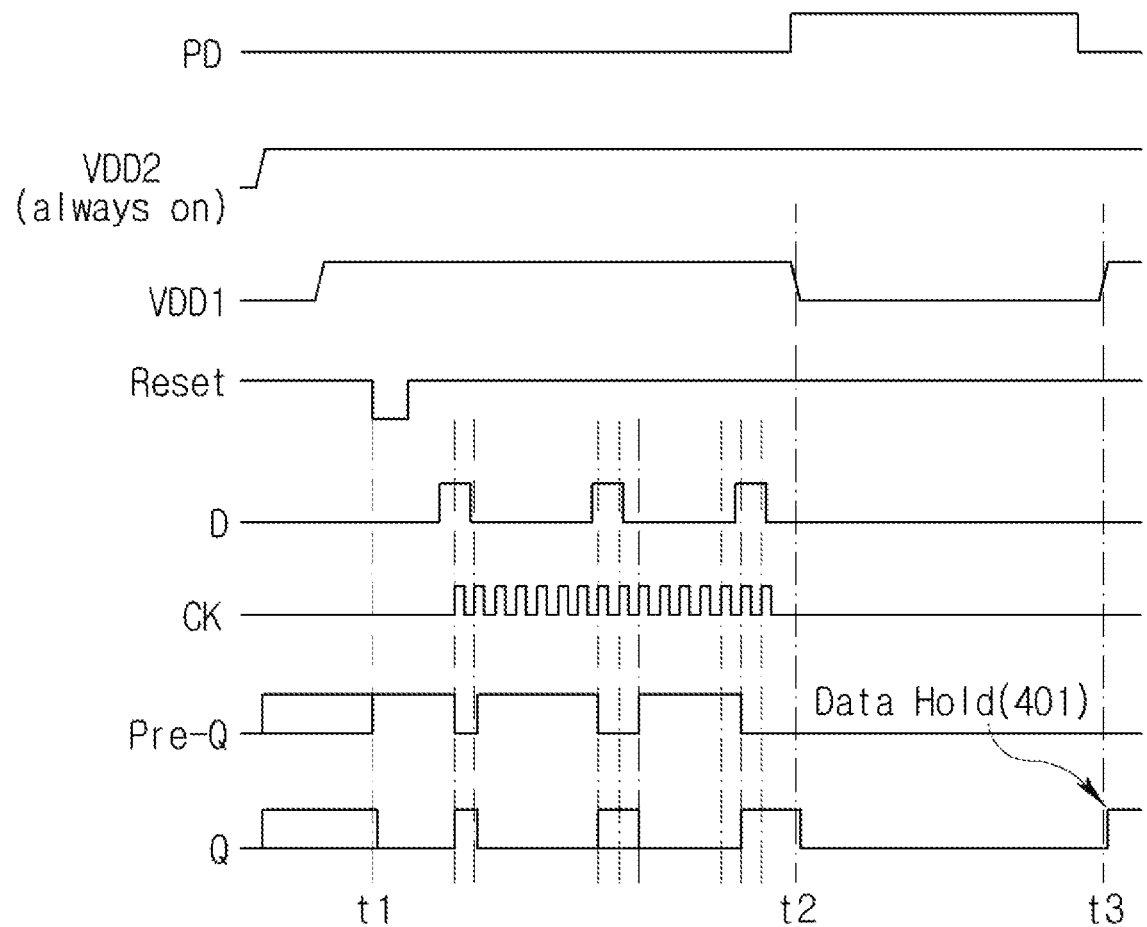
FIG. 4 illustrates a diagram showing the operation of an example low-power retention flip-flop which has the negative reset function, in accordance with one or more embodiments.

FIG. 4 illustrates a diagram of the operation of the low-power retention flip-flop which has the negative reset function, in accordance with one or more embodiments.

As illustrated in FIG. 4, when power is supplied through the second power terminal VDD2 in the low-power retention flip-flop and the low-level power down signal PD indicating a normal operation mode is applied, the power can be supplied through the first power terminal VDD1 connected to the second power terminal VDD2 through a power down switch array (PD switch array). Accordingly, the master latch 310 and the slave latch 320 of the low-power retention flip-flop may be able to operate in the normal operation mode, a value of an output Q may be randomly determined by a race condition between input and output of a feedback loop of the slave latch 320 until the negative reset signal RN (Reset) is input. When the negative reset signal RN (Reset) is input at a first time point t1, the output Q may be 1'b0 at a negative edge (or a falling edge). Then, the low-power retention flip-flop can operate in the normal operation mode.

Then, when the high-level power down signal PD is, to switch to the idle and/or sleep mode, input at a second time point t2, power may be continuously supplied to only some circuit elements 322 of the slave latch 320 and PD and RN-related buffers 332, and power supply may be cut off to the other circuits. Accordingly, some circuit elements 322 within the slave latch 320 form a closed loop, so that data immediately before the high-level power down signal is input can be held (data hole 401). In an example, as the power of the sixth inverter I5 disposed at an output terminal of the slave latch 320 is turned off, the output Q falls to the ground level due to leakage current of an output node over the time.

Then, when the low-level power down signal PD is, to switch to the normal operation mode, input at a third time point t3, the power is supplied again to the sixth inverter I5 disposed at the output terminal of the slave latch 320. Accordingly, a value of the fourth node Pre-Q of the slave latch is transferred to the sixth inverter I5, and the sixth inverter I5 inverts the value and outputs, so that the data before switching to the power down mode can be restored and output.

As described above, the operation of the low-power retention flip-flop having the negative reset function may be illustrated in Table 1 below.

TABLE 1

| PD | RN | D | CK | Q | Mode |
|---|---|---|---|---|---|
| 0 | 0 | X | X | 0 | Reset |
| 0 | 1 | 0 | ↑ | 0 | Normal Operation |
| 0 | 1 | 1 | ↑ | 1 | Normal Operation |
| 0 | 1 | X | ↓ | Q | Data Hold |
| 0 -> 1 | X | X | X | 0 | Power Down |
| 1 -> 0 | X | X | X | Q | Data Recovery(Power Up) |

As illustrated in Table 1, the low-power retention flip-flop may perform a reset mode before operating in a normal operation mode. In this example, as the low-level negative reset signal RN is input, the value of the output terminal Q of the slave latch 320 may become 0. Then, as the low-power retention flip-flop operates in the normal operation mode, a signal corresponding to the input signal D may be output to the output terminal Q at the rising edge "↑" of the clock signal CK.

Then, when the power down signal PD is, to switch to the power down mode, switched from a low level to a high level (0→1), the slave latch 320 can hold data within the slave latch 320 immediately before the power down signal is input (Data Hold). In an example, the slave latch 320 may form a closed loop through some circuit elements 322 (Always-on-circuit) within the slave latch 320 and hold the data. Additionally, the power of the inverter disposed at the output terminal of the slave latch 320 is turned off, so that the value of the output terminal Q can be zero.

When the power down signal PD is switched from a high level to a low level (1→0) in order to switch from the power down mode to the normal mode, the power of the inverter disposed at the output terminal of the slave latch 320 can be turned on. Accordingly, the slave latch 320 inverts and outputs the data value held in some circuits (Always-on-circuit) 322 within the slave latch 320, by using the turned-on inverter, so that the data immediately before the power down mode can be recovered (Data Recovery) and output.

Figure 5:
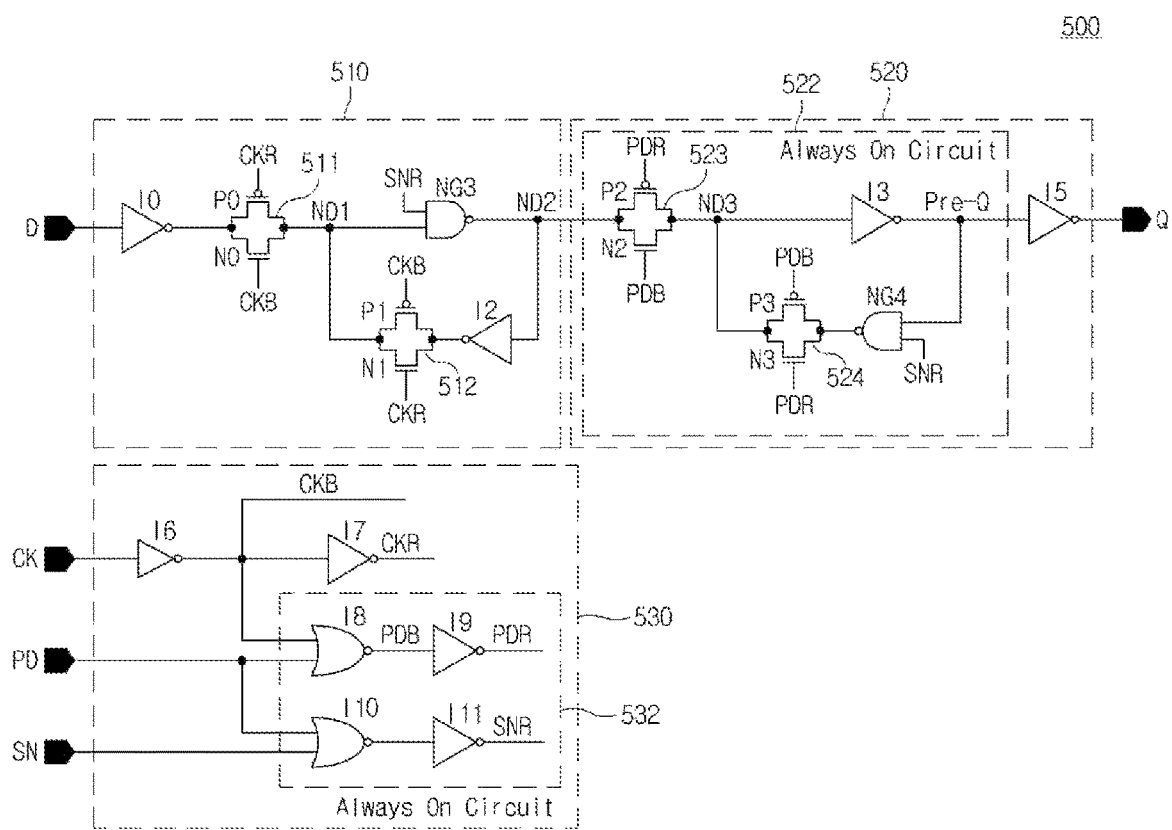
FIG. 5 illustrates an example circuit structure of an example low-power retention flip-flop which has a negative set function, in accordance with one or more embodiments.

FIG. 5 illustrates an example circuit structure of an example low-power retention flip-flop which has a negative set function, in accordance with one or more embodiments. FIG. 5 illustrates an example circuit structure to which the negative set function is added, as an embodiment of the example low-power retention flip-flop 100 illustrated in FIG. 1.

Referring to FIG. 5, a low-power retention flip-flop 500 may include a master latch 510, a slave latch 520, and a control logic 530. The master latch 510, the slave latch 520, and the control logic 530 may be similar to the master latch 110, the slave latch 120, and the control logic 130 respectively illustrated in FIG. 1.

In one or more examples, the master latch 510 may receive power through first power terminal VDD1, and may store (maintain) or output the input signal D in accordance with the first and second clock signals CKB and CKR provided from the control logic 530. In an example, the master latch 510 may receive a first negative set signal SNR provided from the control logic 530, in order to set an initial state to a specific value.

In an example, as shown in FIG. 5, the master latch 510 may include the first inverter I0, a first transfer gate 511, a second transfer gate 512, a third NAND gate NG3, and the third inverter I2. The master latch 510 illustrated in FIG. 5 may be different from the master latch 210 illustrated in FIG. 2 in that the master latch 510 may include the third NAND gate NG3 instead of an inverter disposed between the first node ND1 and the second node ND2. The other components of the master latch 510 may be the same as the other components of the master latch 210 illustrated in FIG. 2. The third NAND gate NG3 of the master latch 510 may perform a negative OR operation on the first negative set signal SNR and a signal of the first node ND1, and may output the result of the operation. The first negative set signal SNR may be generated based on a negative set signal SN and the power down signal PD. When the first negative set signal SNR is at a high level, the output of the third NAND gate NG3 may vary depending on the signal of the first node ND1. When the first negative set signal SNR is at a low level, the third NAND gate NG3 may output a high-level signal by the first negative set signal SNR, regardless of the signal of the first node ND1. In an example, since the structure and operation of the master latch 510 other than the third NAND gate NG3 may be the same as the structure and operation of the master latch 210 illustrated in FIG. 2, a description thereof will be omitted.

In an example, as illustrated in FIG. 5, the slave latch 520 may include a third transfer gate 523, a fourth transfer gate 524, the fourth inverter I3, and a fourth NAND gate NG4, and the sixth inverter I5. The slave latch 520 illustrated in FIG. 5 may be different from the slave latch 220 illustrated in FIG. 2 in that the slave latch 520 may include the fourth NAND gate NG4 instead of an inverter between the fourth node Pre-Q and the fourth transfer gate 524. The other components of the slave latch 520 may be the same as the other components of the slave latch 220 illustrated in FIG. 2. The fourth NAND gate NG4 of the slave latch 520 may perform a negative OR operation on the first negative set signal SNR and a signal of the fourth node Pre-Q and may output the result. When the first negative set signal SNR is at a high level, the output of the fourth NAND gate NG4 may vary depending on the signal of the fourth node Pre-Q. When the first negative set signal SNR is at a low level, the fourth NAND gate NG4 may output a high-level signal by the first negative set signal SNR, regardless of the output signal of the fourth node Pre-Q. Here, since the structure and operation of the slave latch 520 other than the fourth NAND gate NG4 may be the same as the structure and operation of the slave latch 220 of FIG. 2, a description thereof will be omitted.

In one or more examples, the control logic 530 may output a signal to control at least one transfer gate included in the master latch 510 and the slave latch 520, based on the clock signal CK and/or the power down signal PD. In an example, the control logic 530 may output the first negative set signal SNR to set the initial states of the master latch 510 and the slave latch 520 to a specific value, based on the negative set signal SN and the power down signal PD.

In an example, as shown in FIG. 5, the control logic 530 may include the seventh inverter I6, the eighth inverter I7, the first NOR gate I8, the ninth inverter I9, and a second NOR gate I10, and a tenth inverter I11. In an example, the seventh inverter I6, the eighth inverter I7, the first NOR gate I8, and the ninth inverter I9 may be connected in the same structure as the structure of the control logic 230 illustrated in FIG. 2, and may operate in the same manner. In an example, the control logic 530 may be configured such that the second NOR gate I10 and the tenth inverter I11 are further included in the structure of the control logic 230 illustrated in FIG. 2.

In an example, a method to output the first clock signal CKB, the second clock signal CKR, the first power down clock signal PDB, and the second power down clock signal PDR, which control the transfer gates of the master latch 510 and the slave latch 520 based on the clock signal CK and/or the power down signal PD to which the control logic 530 is input, may be the same as the control logic 230 of FIG. 2.

In an example, the control logic 530 may output the first negative set signal SNR to be provided to the NAND gates NG3 and NG4 of the master latch 510 and the slave latch 520, based on the power down signal PD and the negative set signal SN which are input by using the second NOR gate I10 and the tenth inverter I11. In an example, the control logic 530 may perform a NOR (Negative OR) operation on the power down signal PD and the negative set signal SN through the NOR gate I10, may invert the NOR result through the tenth inverter I11, and may then output the first negative set signal SNR.

In one or more examples, when a set event does not occur, the negative set signal SN may be at a high level. In this example, since the second NOR gate I10 always outputs a low-level signal regardless of the power down signal PD, the tenth inverter I11 may output the high-level first negative set signal SNR.

In one or more examples, when a set event occurs, the negative set signal SN may be at a low level. In this example, the output signal of the second NOR gate 110 may vary depending on the power down signal PD. However, since the set event and a switching event to the power down mode do not occur at the same time, the power down signal PD may become a low level indicating an inactive state of the power down mode while the negative set signal SN is at a low level. Accordingly, the output signal of the second NOR gate 110 may become a high level, and the tenth inverter I11 may output the low-level first negative set signal SNR.

In one or more examples, some circuit elements of the control logic 530 may be connected to the first power terminal VDD1 to receive power through the first power terminal VDD1, and some circuit elements may be connected to the second power terminal VDD2 to receive power through the second power terminal VDD2. In the control logic 530 of FIG. 5, not only the circuit elements (e.g., PD-related buffers) which generate the first and second power down clock signals PDB and PDR to control the transfer gates of the slave latch 520, but also the circuit elements (e.g., SN-related buffers) which generate the first negative set signal SNR may also be connected to the second power terminal VDD2 to receive power through the second power terminal VDD2. In an example, the first NOR gate I8, the ninth inverter I9, the second NOR gate I10, and the tenth inverter I11 within the control logic 530 may be an Always-on-circuit 532 which always receives the power through the second power terminal VDD2, irrespective of the normal operation mode or the power down mode. In an example, the power may also always be supplied to the second NOR gate 110 and the tenth inverter I11. Accordingly, the first negative set signal SNR supplied to the slave latch 520 of FIG. 3 can be maintained even in the power down mode.

As described above, in the low-power retention flip-flop according to various examples, the output terminal Q of the slave latch may be set to 1'b1 by using the negative set signal.

As described above, the operation of the low-power retention flip-flop having the negative set function may be shown in Table 2 below.

TABLE 2

| PD | SN | D | CK | Q | Mode |
|----|----|----|----|----|------|
| 0 | 0 | X | X | 1 | set |
| 0 | 1 | 0 | ↑ | 0 | Normal Operation |

TABLE 2-continued

| PD | SN | D | CK | Q | Mode |
|---|---|---|---|---|---|
| 0 | 1 | 1 | ↑ | 1 | Normal Operation |
| 0 | 1 | X | ↓ | Q | Data Hold |
| 0 -> 1 | X | X | X | 0 | Power Down |
| 1 -> 0 | X | X | X | Q | Data Recovery(Power Up) |

As illustrated in Table 2, the low-power retention flip-flop may perform a set mode before operating in a normal operation mode. In order to perform the set mode, as the low-level negative set signal SN is input, the value of the output terminal Q of the slave latch 520 may become 1. After performing the set mode, the low-power retention flip-flop may operate in the normal operation mode. Accordingly, a signal corresponding to the input signal D may be output to the output terminal Q at the rising edge "↑" of the clock signal CK.

When the power down signal PD is, for switching to the power down mode, switched from a low level to a high level (0→1), the slave latch 520 can hold data within the slave latch 520 immediately before the power down signal is input (Data Hold). In an example, the slave latch 520 may form a closed loop through some circuit elements 522 (Always-on-circuit) within the slave latch 520 and hold the data. Additionally, the power of the inverter disposed at the output terminal of the slave latch 520 is turned off, so that the value of the output terminal Q can be zero.

When the power down signal PD is switched from a high level to a low level (1→0) in order to switch from the power down mode to the normal mode, the power of the inverter disposed at the output terminal of the slave latch 520 can be turned on. Accordingly, the slave latch 520 inverts and outputs the data value held in some circuits (Always-on-circuit) 522 within the slave latch 520, by using the turned-on inverter, so that the data immediately before the power down mode can be recovered (Data Recovery) and output.

Figure 6A:
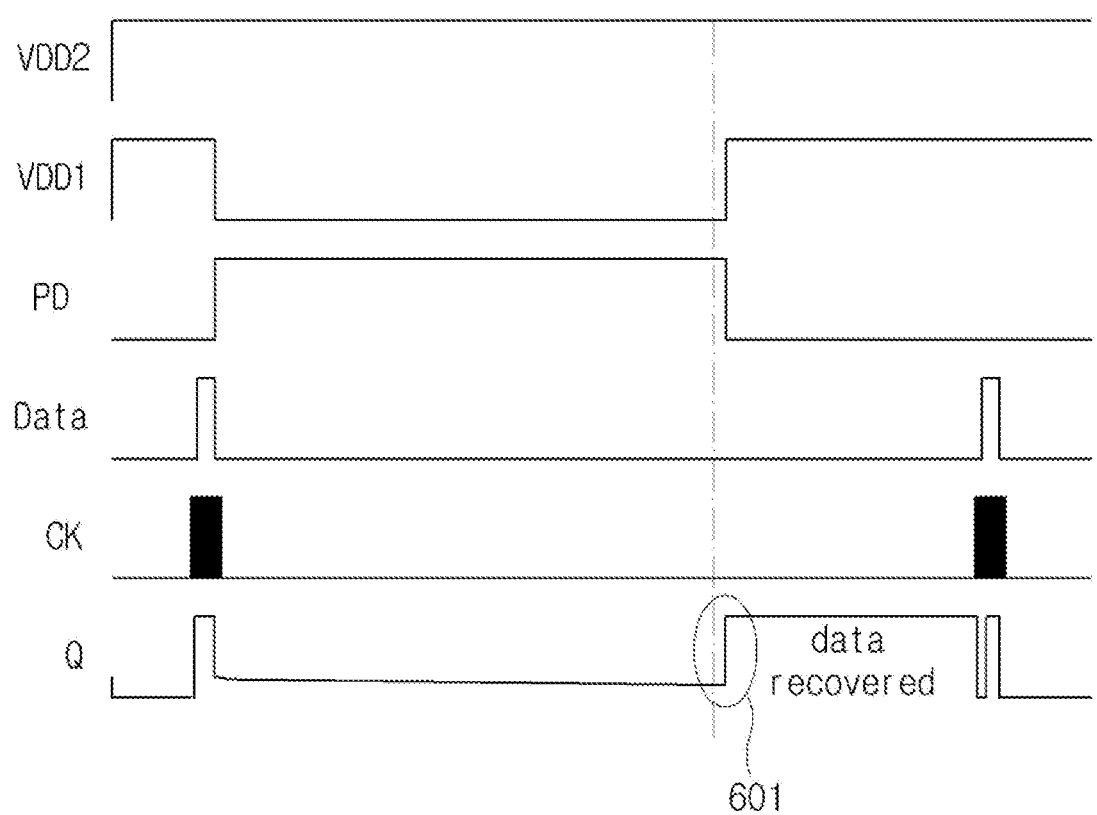
FIGS. 6A, 6B, and 6C illustrate example simulation results of the operation of an example low-power retention flip-flop, in accordance with one or more embodiments.
Figure 6B:
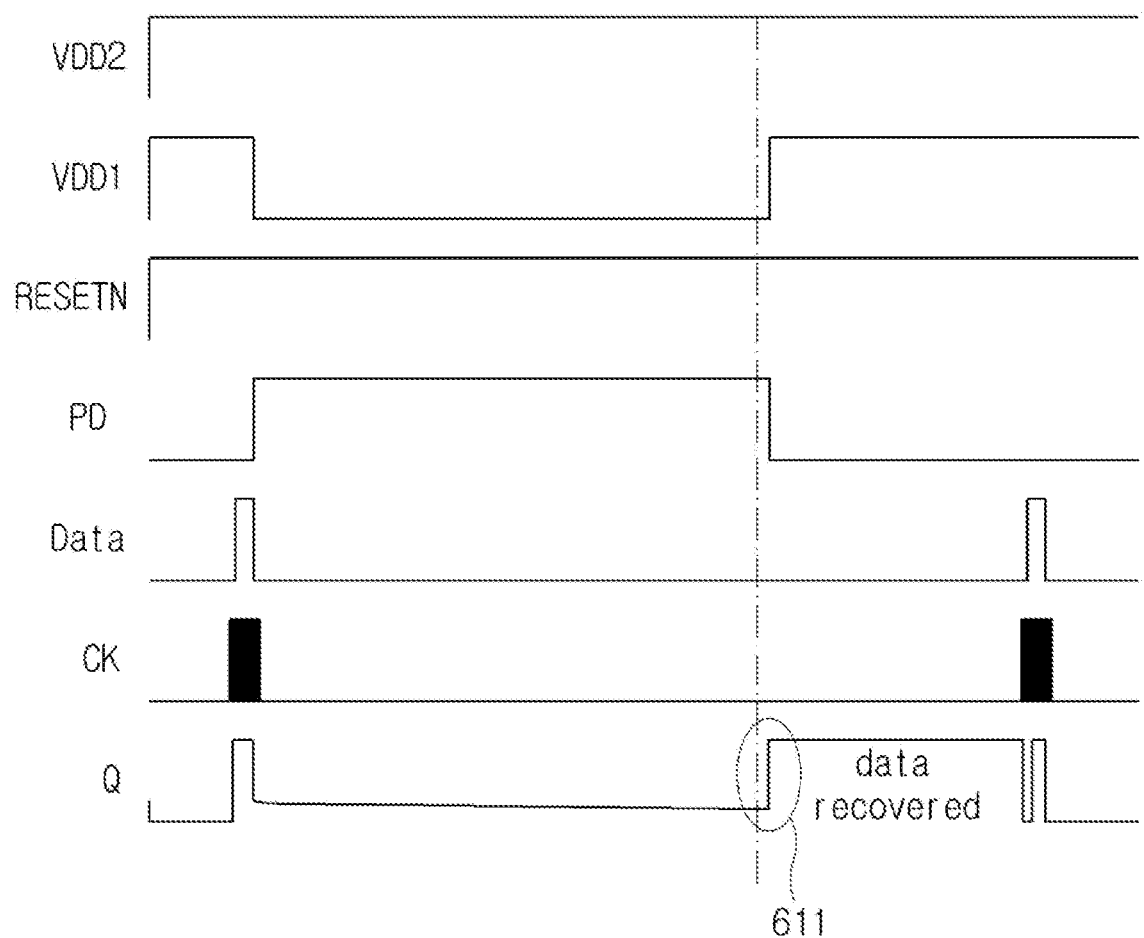
Figure 6C:
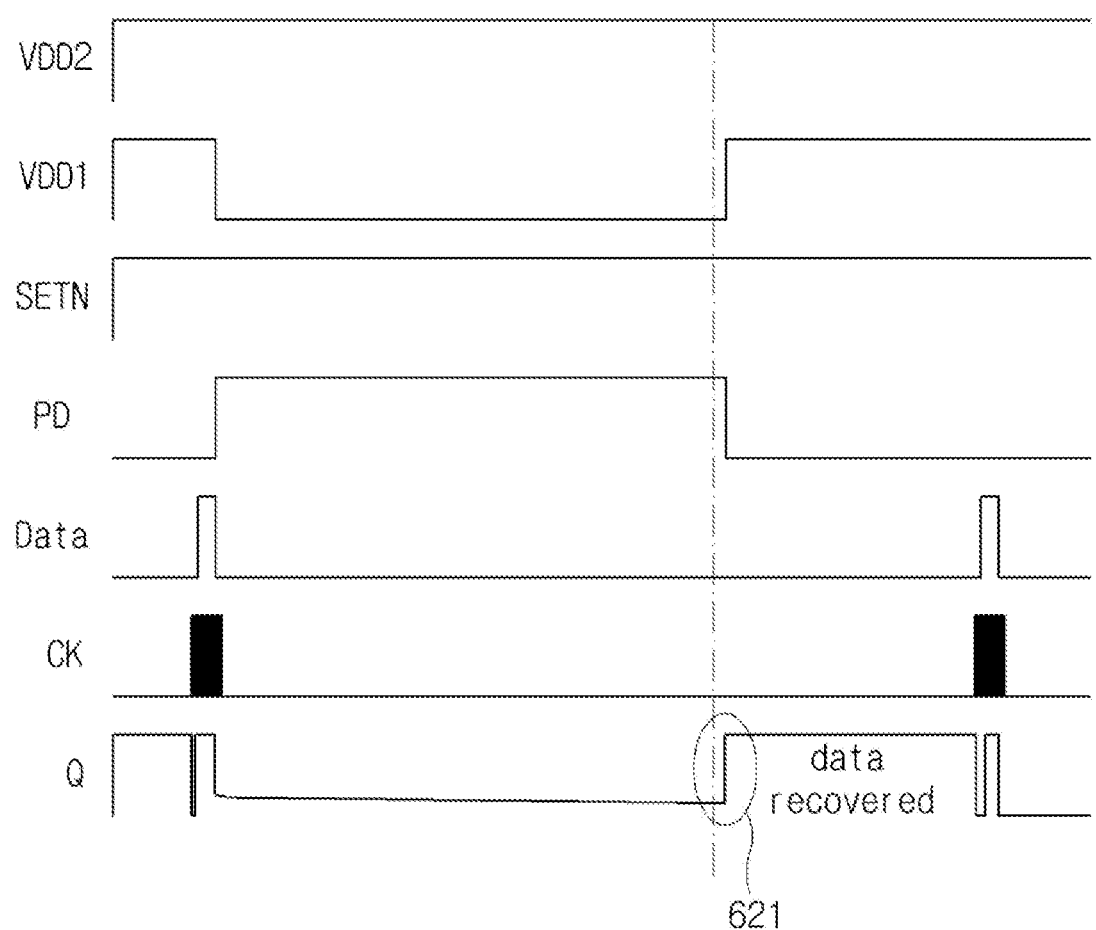

FIGS. 6A, 6B, and 6C illustrate simulation results of the operation of an example low-power retention flip-flop, in accordance with one or more embodiments. FIG. 6A illustrates a simulation result of the operation of the example low-power retention flip-flop 200 illustrated in FIG. 2, and FIG. 6B shows a simulation result of the operation of the low-power retention flip-flop 300 illustrated in FIG. 3. FIG. 6C illustrates a simulation result of the operation of the example low-power retention flip-flop 500 illustrated in FIG. 5.

Referring to FIGS. 6A, 6B, and 6C, in the low-power retention flip-flops 200, 300, and 500 in accordance with one or more examples, when the power down mode is switched to the normal operation mode, the data immediately before entering the power down mode can be restored (601, 611, and 621) and output.

In one or more examples, expressions such as the first, the second, the third, etc., are merely expressions for distinguishing corresponding components from other components, and do not have a specific meaning. In an example, the inverters I3 and I4 included in the slave latches 120 and 220 are only referred to as the fourth inverter "I3 and the fifth inverter I4 so that they may be distinguished from the inverters I0, I1 and I2 included in the master latches 110 and 210, and the inverters I6, I7, and I9 included in the control logic 130. The names of the inverters I3 and I4 are not limited thereto. In an example, the inverters I3 and I4 included in the slave latches 120 and 220 may be referred to as the first inverter I3 and the second inverter I4, respectively. In another example, the inverters I6, I7, and I9 included in the control logic 130 are only referred to as the seventh inverter I6, the eighth inverter I7, and the ninth inverter I9 so that they may be distinguished from the inverters I0, I1, and I2 included in the master latches 110 and 210 and the inverters I3 and I4 included in the slave latches 120 and 220. The names of the inverters I6, I7, and I9 are not limited thereto. In an example, the inverters I6, I7, and I9 included in the control logic 130 may be referred to as the first inverter I6, the second inverter I7, and the third inverter I9, respectively.

The low-power retention flip-flops 200, 300, and 500, and other apparatuses, units, modules, devices, and other components described herein and with respect to FIGS. 1-6C, are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods that perform the operations described in this application and illustrated in FIGS. 1-6C are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller, e.g., as respective operations of processor implemented methods. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computers using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media.

Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD–Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions.

In one example, the instructions or software and any associated data, data files, and data structures are distributed over network-coupled computer systems so that the instructions and software and any associated data, data files, and data structures are stored, accessed, and executed in a distributed fashion by the one or more processors or computers.

A number of example embodiments have been described above. Nevertheless, it should be understood that various modifications may be made to these example embodiments. In an example, suitable results may be achieved if the described techniques are performed in a different order and/or if components in a described system, architecture, device, or circuit are combined in a different manner and/or replaced or supplemented by other components or their equivalents.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A retention flip-flop, comprising:
a master latch comprising a transfer gate configured to generate an output signal based on an input signal and first control signals;
a slave latch, configured to output the output signal from the master latch based on second control signals, wherein the slave latch comprises:
a first circuit configured to continuously maintains a power-on state, transfers the output signal of the master latch based on the second control signals in a normal operation mode, and maintains the output signal of the master latch by forming a closed loop based on the second control signals in a power down mode, wherein the first circuit comprises a first inverter and transfer gates configured to generate an output signal of the first circuit based on the output signal from the master latch; and
a second circuit comprising a second inverter connected to an output terminal of the first circuit to receive the output signal of the first circuit, wherein, when the power down mode is switched to the normal operation mode, the second inverter is turned on and inverts and outputs a signal of the closed loop; and
a control logic configured to:
generate the first control signals based on a clock signal and provide the generated first control signals to the master latch;
generate the second control signals based on the clock signal and a power down mode signal and provide the generated second control signals to the slave latch; and generate a first negative reset or set signal based on an input negative reset or set signal and the power down mode signal and output the first negative reset or set signal to a first NAND gate of the master latch and a second NAND gate of the slave latch, respectively, wherein the transfer gate and the first NAND gate of the master latch, the second inverter of the slave latch, and first circuit elements of the control logic configured to generate the first control signals are connected to a first power terminal configured to supply or disconnect power based on an initiation of the power down mode, and wherein the second NAND gate of the slave latch, the first circuit of the slave latch, second circuit elements of the control logic configured to generate the second control signals, and third circuit elements of the control logic configured to generate the first negative reset or set signal are connected to a second power terminal configured to supply power continuously regardless of the initiation of the power down mode.

2. The retention flip-flop of claim 1, wherein the control logic comprises:
a third inverter, configured to invert and output the clock signal;
a fourth inverter, configured to invert and output the output signal of the third inverter;
a first NOR gate, configured to perform a negative OR operation on the output signal of the third inverter and the power down mode signal; and
a fifth inverter, configured to invert and output an output signal of the first NOR gate,
wherein the first control signals comprise a first clock signal that is the output signal of the third inverter, and a second clock signal that is the output signal of the fourth inverter, and
wherein the second control signals comprise a first power down clock signal that is the output signal of the first NOR gate, and a second power down clock signal that is the output signal of the fifth inverter.

3. The retention flip-flop of claim 2, wherein, when the power down mode signal is a low level indicating an inactive state of the power down mode, the second control signals vary based on the clock signal, and
wherein, when the power down mode signal is a high level indicating an active state of the power down mode, the second control signals have a constant value regardless of the clock signal.

4. The retention flip-flop of claim 2, wherein the first circuit elements related to the first control signals comprise at least one of the third inverter and the fourth inverter, and wherein the second circuit elements related to the second control signals comprise at least one of the fifth inverter and the first NOR gate.

5. The retention flip-flop of claim 2, wherein each of the master latch and the slave latch is configured to receive the first negative reset signal and set an initial state value based on the received first negative reset signal.

6. The retention flip-flop of claim 5, wherein the control logic further comprises:
a second NOR gate, configured to perform a negative OR operation on the power down mode signal and the input negative reset signal; and
a sixth inverter, configured to generate the first negative reset signal by inverting an output signal of the second NOR gate and output the first negative reset signal.

7. The retention flip-flop of claim 2, wherein the control logic is configured to generate the first negative set signal based on the input negative set signal and the power down mode signal, and output the first negative set signal to the master latch and the slave latch, respectively, and
wherein each of the master latch and the slave latch is configured to receive the first negative set signal and set an initial state value based on the received first negative set signal.

8. The retention flip-flop of claim 7, wherein the control logic further comprises:
a second NOR gate, configured to perform a negative OR operation on the power down mode signal and the negative set signal; and
a sixth inverter, configured to generate the first negative set signal by inverting an output signal of the second NOR gate and output the first negative set signal.

9. The retention flip-flop of claim 7, wherein each of the master latch and the slave latch comprises a comprising the first NAND gate and the second NAND gate, respectively, is configured to perform a negative OR operation on the first negative set signal, and a signal from a node within each of the master latch and the slave latch.

10. The retention flip-flop of claim 1, wherein the first circuit elements of the control logic comprise at least two inverters.

11. The retention flip-flop of claim 1, wherein the second circuit elements of the control logic comprise a NOR gate connected to the first circuit elements and an inverter.

12. The retention flip-flop of claim 1, wherein the third circuit elements of the control logic comprise a NOR gate connected to the second circuit elements and an inverter.

* * * * *